(12) United States Patent
Wu et al.

(10) Patent No.: US 11,340,286 B2
(45) Date of Patent: May 24, 2022

(54) ON-WAFER S-PARAMETER CALIBRATION METHOD

(71) Applicant: THE 13TH RESEARCH INSTITUTE OF CHINA ELECTRONICS TECHNOLOGY GROUP CORPORATION, Hebei (CN)

(72) Inventors: Aihua Wu, Shijiazhuang (CN); Chong Li, Shijiazhuang (CN); Chen Liu, Shijiazhuang (CN); Yibang Wang, Shijiazhuang (CN); Xingchang Fu, Shijiazhuang (CN); Faguo Liang, Shijiazhuang (CN); Xiuwei Tian, Shijiazhuang (CN); Yanan Liu, Shijiazhuang (CN); Jian Cao, Shijiazhuang (CN)

(73) Assignee: THE 13TH RESEARCH INSTITUTE OF CHINA ELECTRONICS, Hebei (CN)

(*) Notice: Subject to any disclaimer, the term of this patent is extended or adjusted under 35 U.S.C. 154(b) by 277 days.

(21) Appl. No.: 16/625,329

(22) PCT Filed: Dec. 29, 2018

(86) PCT No.: PCT/CN2018/125285
§ 371 (c)(1),
(2) Date: Dec. 20, 2019

(87) PCT Pub. No.: WO2020/107623
PCT Pub. Date: Jun. 4, 2020

(65) Prior Publication Data
US 2022/0003811 A1    Jan. 6, 2022

(30) Foreign Application Priority Data
Nov. 27, 2018 (CN) .......................... 201811469568.2

(51) Int. Cl.
*G01R 31/28* (2006.01)
*G01R 35/00* (2006.01)

(52) U.S. Cl.
CPC ..... *G01R 31/2853* (2013.01); *G01R 31/2886* (2013.01); *G01R 35/005* (2013.01)

(58) Field of Classification Search
CPC ............ G01R 31/2853; G01R 31/2886; G01R 35/005
See application file for complete search history.

(56) References Cited

U.S. PATENT DOCUMENTS 5,734,268 A    3/1998 Bockelman
7,256,585 B1 *  8/2007 Shoulders .............. G01R 27/04
                                                      324/601

(Continued)

FOREIGN PATENT DOCUMENTS

CN    101339213 A    1/2009
CN    101369825 A    2/2009

(Continued)

OTHER PUBLICATIONS

Dylan F. Williams et al., "Crosstalk Corrections for Coplanar-Waveguid Scattering-Parameter Calibrations", IEEE Transactions on Microwave Theory and Techniques, vol. 62, No. 8, Aug. 2014, pp. 1748-1761. (Year: 2014).*

(Continued)

*Primary Examiner* — Akm Zakaria
(74) *Attorney, Agent, or Firm* — Cooper Legal Group, LLC

(57) ABSTRACT

The present application is applicable to the technical field of terahertz on-wafer measurement, and provides a new on-wafer S-parameter calibration method and device. The method includes: performing two-port calibration on a waveguide end face when a probe is not connected to a test (Continued)

system; performing one-port calibration on each of two probe end faces when the probe is connected to the test system; and fabricating a crosstalk calibration standard equal to a device under test in length on a substrate of the device under test, and correct a crosstalk error of the test system according to the crosstalk calibration standard. The present application can realize accurate characterization and correction of crosstalk error in a high-frequency on-wafer S-parameter calibration process, and improve the accuracy of error correction in high-frequency on-wafer S-parameter measurement.

9 Claims, 5 Drawing Sheets

(56) References Cited

U.S. PATENT DOCUMENTS

| | | | |
|---|---|---|---|
| 9,286,177 | B1 | 3/2016 | Pritchard et al. |
| 10,890,642 | B1* | 1/2021 | Kasper ................ G01R 31/389 |
| 2004/0246004 | A1 | 12/2004 | Heuermann |
| 2009/0051380 | A1* | 2/2009 | Chladek ............... G01R 35/005 |
| | | | 324/762.02 |
| 2011/0208467 | A1 | 8/2011 | Tang |
| 2017/0315206 | A1* | 11/2017 | Leibfritz ................ G01R 27/04 |

FOREIGN PATENT DOCUMENTS

| | | |
|---|---|---|
| CN | 103399286 A | 11/2013 |
| CN | 103605024 A | 2/2014 |
| CN | 103983931 A | 8/2014 |
| CN | 104111435 A | 10/2014 |
| CN | 104297597 A | 1/2015 |
| CN | 104865453 A | 8/2015 |
| CN | 105277800 A | 1/2016 |
| CN | 105677974 A | 6/2016 |
| CN | 106771709 A | 5/2017 |
| CN | 107861050 A | 3/2018 |
| CN | 107991537 A | 5/2018 |
| CN | 108664717 A | 10/2018 |
| JP | 2006317156 A | 11/2006 |

OTHER PUBLICATIONS

Application Note: "On-Wafer Vector Network Analyzer Calibration and Measurements", Apr. 1997, Cascade Microtech Retrieved from the Internet: URL: https://www.cascademicrotech.com/files/ONWAFER.pdf, 13 pgs.
"A New SOLT Calibration Method for Leaky On-Wafer Measurements Using a 10-Term Error Model", Aug. 2018, Chen Liu, Aihua Wu, Chong Li and Nick Ridler; IEEE Transactions on Microwave Theory and Techniques, vol. 66, No. 8, 31, pp. 1.7.
"Analytical Model and Parameter Extraction to Account for the Pad Parasitics in RF-CMOS", Jul. 2005; Reydezel Torres-Torres, Robert Murphy-Arteaga and J. Apolinar Reynoso-Hernandez; IEEE Transactions on Electron Devices, IEEE Service Center, Piscataway, NJ, US. vol. 52, No. 7, 31, pp. 1335-1342.
Supplementary European Search Report in the European application No. 18925049.1, dated Mar. 4, 2021 10 pgs.
International Search Report in the international application No. PCT/CN2018/125285 dated Jul. 25, 2019.
Methodology for Extracting S-Parameter of Coplanar Microwave Probe / Wu, Aihua et al., Published on Dec. 31, 1985, pp. 1-4.
Measurement Principle of Microwave Automatic Network Analyzer / Dong Shuyi, Published on Dec. 31, 1958, pp. 1-9.

* cited by examiner open-open pair    short-short pair    load-load pair

ON-WAFER S-PARAMETER CALIBRATION METHOD

TECHNICAL FIELD

The present application belongs to the technical field of terahertz on-wafer measurement, and in particular relates to a new on-wafer S-parameter calibration method.

BACKGROUND

With the development of the vector network analysis technology, the on-wafer S-parameter error correction model and calibration method have been continuously proposed and improved, and have been widely used in the fields of coaxial, waveguide and low-frequency on-wafer S-parameter measurements. However, as the measurement frequency increases, the distance between two probes is also getting closer and closer during the S-parameter measurement test. Electromagnetic waves are transmitted not only in a device under test, but also in the air above the device under test and on the substrate under the device under test, causing crosstalk between the two probes. Moreover, the higher the frequency, the closer the two probes in the measurement process, and the greater the crosstalk error.

At present, the on-wafer S-parameter error model only considers the distance factor between two probes when correcting the crosstalk error. The correction of the crosstalk error is imperfect, making the calibration of the on-wafer S-parameter inaccurate, and affecting the accuracy of measurement of the on-wafer S-parameter.

SUMMARY

Technical Problem

In view of this, the embodiment of the present application provides a new on-wafer S-parameter calibration method to solve the problems in the prior art that when the crosstalk terms are corrected in on-wafer S-parameter measurement error correction, only the distance factor between the two probes is considered, and the crosstalk error correction is not perfect, which affects the accuracy of the on-wafer S-parameter error correction.

Technical Solution

A first aspect of the embodiments of the present application provides a new on-wafer S-parameter calibration method, the method may include: performing two-port calibration on a waveguide end face when a probe is not connected to a test system; performing one-port calibration on each of two probe end faces when the probe is connected to the test system; and fabricating a crosstalk calibration standard equal to a device under test in length on a substrate of the device under test, and correct a crosstalk error of the test system according to the crosstalk calibration standard.

Optionally, the method further includes: after correcting the crosstalk error of the test system according to the crosstalk calibration standard, establishing a 12-term error model, and obtaining an S-parameter of the device under test after calibration of the test system according to the 12-term error model.

Optionally, the operation of establishing the 12-term error model includes: acquiring a first set of error terms through the two-port calibration, and acquiring a second set of error terms through the one-port calibration, where the first set of error terms and the second set of error terms compose an 8-term error model; acquiring four crosstalk error terms by correcting the crosstalk error of the test system; and establishing the 12-term error model according to the 8-term error model and the four crosstalk error terms.

Optionally, the operation of obtaining the S-parameter of the test system after calibration according to the 12-term error model includes: acquiring a first S-parameter through the two-port calibration, where the first S-parameter is an S-parameter in case the device under test is connected in parallel with a crosstalk error network and then cascaded with the probe; obtaining an S-parameter of the probe according to the first set of error terms and the second set of error terms; acquiring an S-parameter of a crosstalk error network by correcting the crosstalk error of the test system; and obtaining the S-parameter of the device under test after calibration of the test system, according to the first S-parameter, the S-parameter of the probe, and the S-parameter of the crosstalk error network.

Optionally, the new on-wafer S-parameter calibration method further includes: when a length of the device under test is changed, repeating the operations of fabricating the crosstalk calibration standard equal to the device under test in length on the substrate of the device under test, and correcting the crosstalk error of the test system according to the crosstalk calibration standard.

A second aspect of the embodiments of the present application provides a new on-wafer S-parameter calibration device, the device may include: a two-port calibration module, configured to perform two-port calibration on a waveguide end face when a probe is not connected to a test system; a one-port calibration module, configured to perform one-port calibration on each of two probe end faces when the probe is connected to the test system; and a crosstalk calibration module, configured to fabricate a crosstalk calibration standard equal to the device under test in length on a substrate of the device under test, and correct a crosstalk error of the test system according to the crosstalk calibration standard.

Optionally, the new on-wafer S-parameter calibration device further includes: a parameter determining module, configured to establish a 12-term error model, and obtain an S-parameter of the device under test after calibration of the test system according to the 12-term error model.

Optionally, the parameter determining module is specifically configured to: acquire a first set of error terms through the two-port calibration, and acquire a second set of error terms through the one-port calibration, where the first set of error terms and the second set of error terms compose an 8-term error model; acquire four crosstalk error terms by correcting the crosstalk error of the test system; and establish the 12-term error model according to the 8-term error model and the four crosstalk error terms.

A third aspect of the embodiments of the present application provides a vector network analyzer, the vector network analyzer may include a memory, a processor, and computer programs stored in the memory and executable on the processor, wherein the processor performs the operations of the on-wafer S-parameter calibration method according to any of the above when executing the computer programs.

A fourth aspect of the embodiments of the present application provides a computer readable storage medium storing computer programs, wherein the computer programs perform the operations of the on-wafer S-parameter calibration method according to any of the above when executed by the processor.

Beneficial Effect

The new S-parameter calibration method of the present application performs three calibrations. Mainly a crosstalk calibration standard equal to a device under test in length is fabricated on the substrate of the device under test, and the crosstalk error of a test system is corrected according to the crosstalk calibration standard. Not only the probe distance factor is considered, but also the reflection coefficient factor of the device under test is considered, and accurate characterization and correction of the crosstalk error is realized. Furthermore, by performing two-port calibration on the waveguide end face when the probe is not connected to the test system, and performing one-port calibration on the probe end face after the probe is connected, the accuracy of error correction in on-wafer S-parameter measurement is improved.

BRIEF DESCRIPTION OF DRAWINGS

In order to more clearly illustrate the technical solutions in the embodiments of the present application, the drawings to be used in the embodiments or the prior art description will be briefly introduced below. It is apparent that the drawings in the following description are only some of the embodiments of the present application, and those skilled in the art can obtain other drawings according to the drawings without any inventive labor.

DETAILED DESCRIPTION

In the following description, for purposes of illustration and not limitation, specific details such as specific system structures, techniques, and the like are set forth to provide a thorough understanding of the embodiments of the present application. However, it will be apparent to those skilled in the art that the present application may be implemented in other embodiments without these specific details. In other instances, detailed descriptions of well-known systems, devices, circuits, and methods are omitted so as not to obscure the description of the application.

In order to explain the technical solutions described in the present application, the following description will be made by way of specific embodiments.

Embodiment 1

Figure 1:
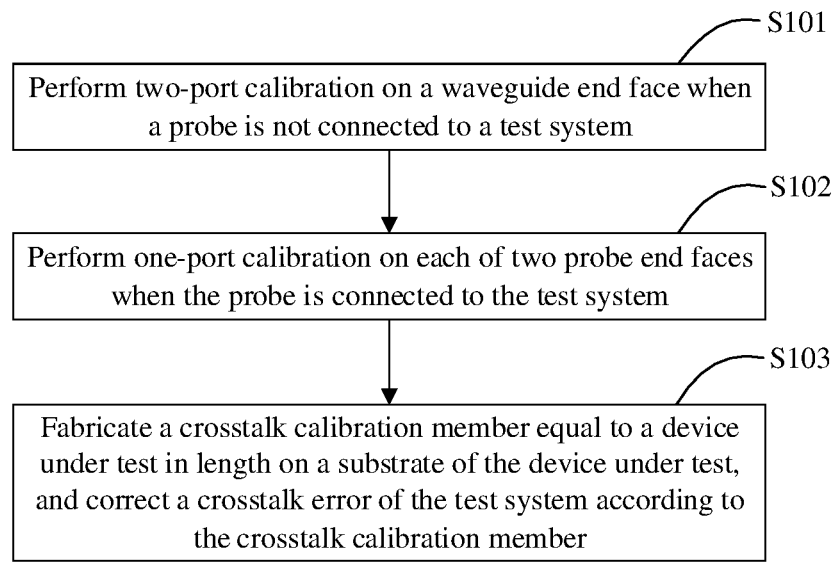
FIG. 1 is a schematic diagram of an implementation process of the new on-wafer S-parameter calibration method provided by the embodiments of the present application.

Referring to FIG. 1, a schematic diagram of an implementation process of a new on-wafer S-parameter calibration method is provided, which is described in detail as follows.

In operation S101, two-port calibration is performed on a waveguide end face when a probe is not connected to a test system.

In operation S102, one-port calibration is performed on each of two probe end faces when the probe is connected to the test system.

In operation S103, a crosstalk calibration standard equal to a device under test in length is fabricated on the substrate of the device under test, and the crosstalk error of the test system is calibrated according to the crosstalk calibration standard.

Figure 2:
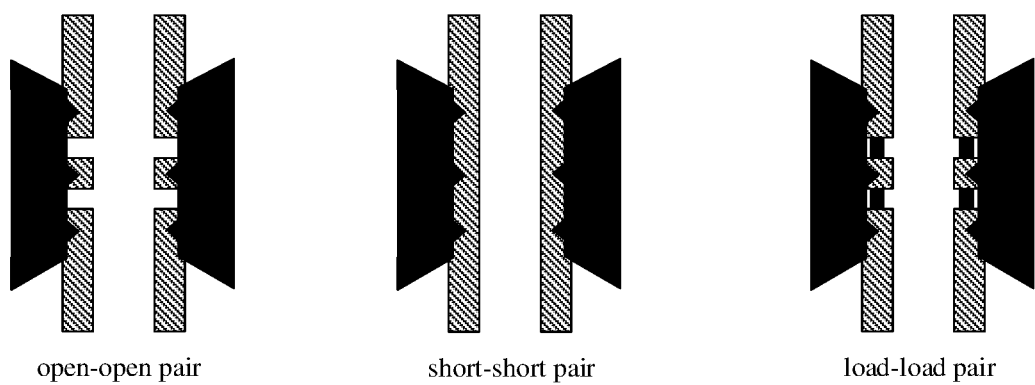
FIG. 2 is a schematic structural diagram of three kinds of calibration standards provided by the embodiments of the present application.

The traditional error model calibration method treats the crosstalk error as a value fixed vector error term. In reality, however, the magnitude of the crosstalk error is not only related to the distance between two probes, but also to the reflection coefficient of the actual device under test. In order to verify that the magnitude of the crosstalk error is also related to the reflection coefficient of the actual device under test, the present embodiment performs comparative tests using three commercial on-wafer S-parameter two-port devices. As shown in FIG. 2, the three commercial on-wafer S-parameter two-port devices are open-open pair, short-short pair, and load-load pair two-port devices respectively, and the three two-port devices have the same length (the probe spacing is the same).

When the spacing between two probes is constant, the reflection coefficient of the device under test also affects the magnitude of crosstalk. Therefore, in the present embodiment, a crosstalk calibration standard part having the same length as the device under test is fabricated on the substrate of the device under test. By crosstalk correction of the test system according to the crosstalk calibration standard part, accurate characterization and correction of crosstalk error is achieved. Furthermore, by performing two-port calibration on the waveguide end face when the probe is not connected to the test system, and performing one-port calibration on the probe end face after the probe is connected, the accuracy of error correction in on-wafer S-parameter measurement is improved.

Optionally, the crosstalk calibration standard part may be an open-open calibration standard part. The present embodiment does not limit the specific structure of the crosstalk calibration standard, and the crosstalk calibration standard may also be a short-short pair or load-load pair type two-port device.

In an embodiment, the method further includes: after calibration of the crosstalk error of the test system according to the crosstalk calibration standard, a 12-term error model is established, and the S-parameter of the device under test after calibration of the test system is obtained according to the 12-term error model.

Figure 3:
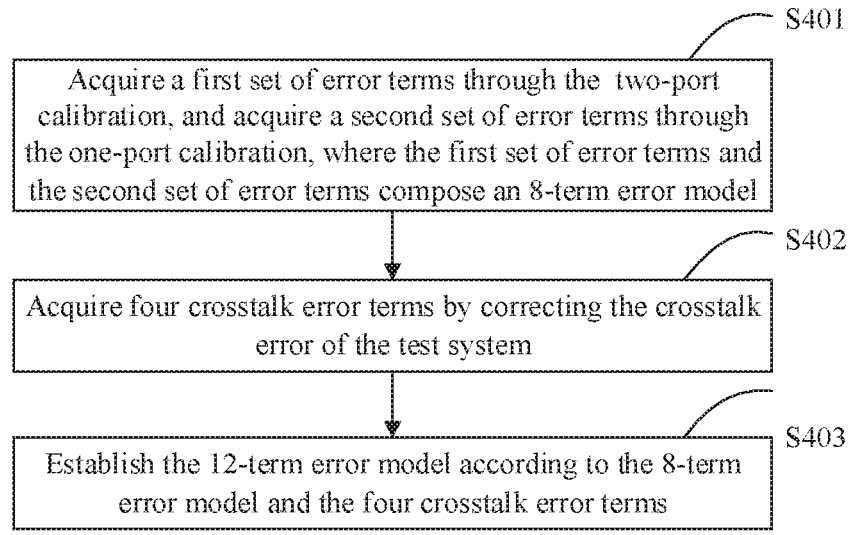
FIG. 3 is a schematic diagram of a specific implementation process for establishing the 12-term error model provided by the embodiments of the present application.

Optionally, referring to FIG. 3, the specific implementation process for establishing the 12-term error model may include the following operations.

In operation S401, a first set of error terms is acquired through the two-port calibration, and a second set of error terms is acquired through the one-port calibration, where the first set of error terms and the second set of error terms compose an 8-term error model.

In operation S402, four crosstalk error terms are acquired by correcting the crosstalk error of the test system.

In operation S403, the 12-term error model is established according to the 8-term error model and the four crosstalk error terms.

Figure 4:
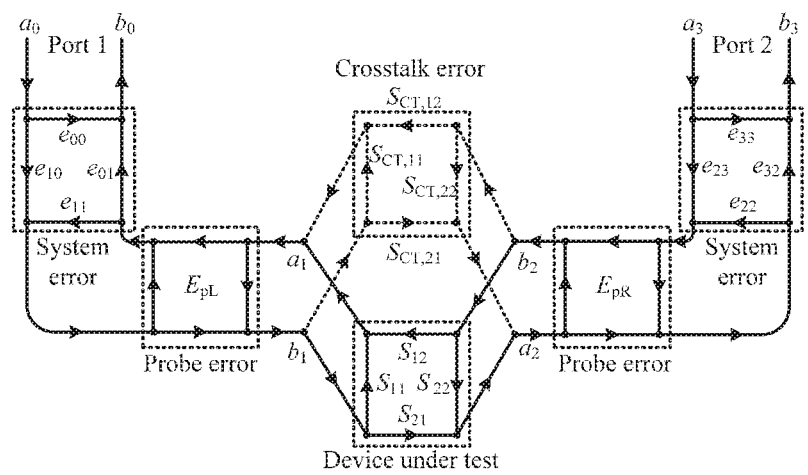
FIG. 4 is a schematic diagram of the 12-term error model provided by the embodiments of the present application.

Specifically, referring to FIG. 4, in the present embodiment, the crosstalk error of the test system is calibrated, that is, four crosstalk error terms ($S_{CT,11}$, $S_{CT,12}$, $S_{CT,21}$ and $S_{CT,22}$ respectively) are added on the basis of the 8-error term model (obtained in operations S101 and S102), and a new on-wafer S-parameter error model including crosstalk error correction is constructed.

Figure 6:
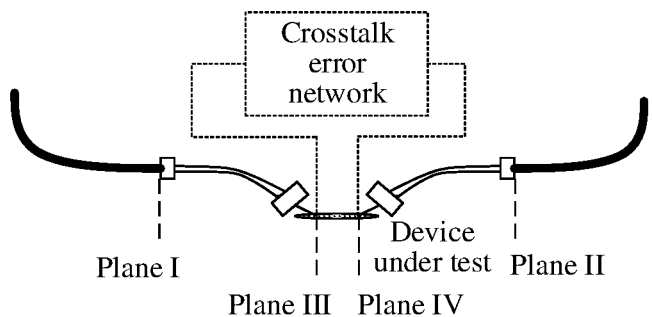
FIG. 6 is a schematic diagram of the calibration planes of operation S101 and operation S102 of FIG. 1.

Since crosstalk occurs between two probe heads, the extended four crosstalk error terms may be regarded as a virtual "two-port device" in which the crosstalk error network CT formed by the two probe heads is connected in parallel with the device under test (DUT). As shown in FIG. 6, the crosstalk error network CT and the DUT which are connected in parallel form a virtual "two-port device". The "two-port device" has its own S-parameter. The magnitude of transmission parameters of electromagnetic waves in the virtual "two-port device" is related to the reflection coefficient of the device under test (DUT). Without considering the crosstalk error, $S_{CT,11}=S_{CT,22}=1$ $S_{CT,12}=S_{CT,21}=0$, and the 12-term error model becomes the traditional 8-term error model.

Figure 5:
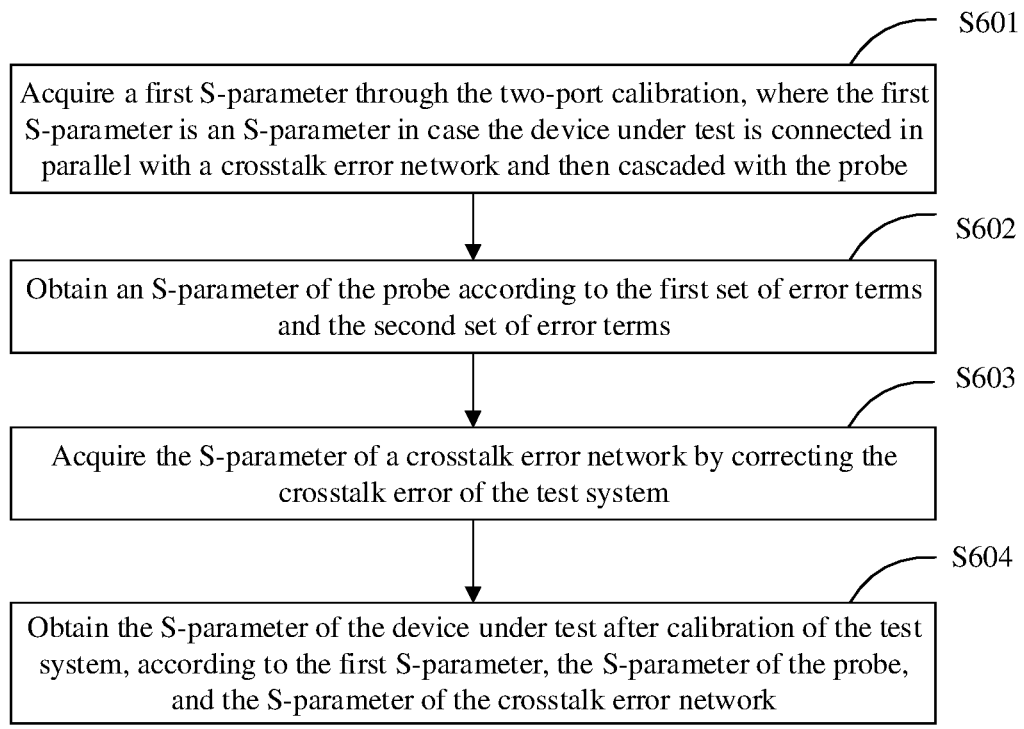
FIG. 5 is a schematic diagram of a specific implementation process for obtaining the S-parameter of the device under test after calibration of a test system according to the 12-term error model provided by the embodiments of the present application.

Optionally, referring to FIG. 5, the specific implementation process for obtaining the S-parameter of the device under test after calibration of the test system according to the 12-term error model includes the following operations.

In operation S601, a first S-parameter is acquired through the two-port calibration, where the first S-parameter is an S-parameter in case the device under test is connected in parallel with a crosstalk error network and then cascaded with the probe.

In operation S602, an S-parameter of the probe is obtained according to the first set of error terms and the second set of error terms.

In operation S603, the S-parameter of a crosstalk error network is acquired by correcting the crosstalk error of the test system.

In operation S604, the S-parameter of the device under test after calibration of the test system is obtained according to the first S-parameter, the S-parameter of the probe, and the S-parameter of the crosstalk error network.

Figure 7:
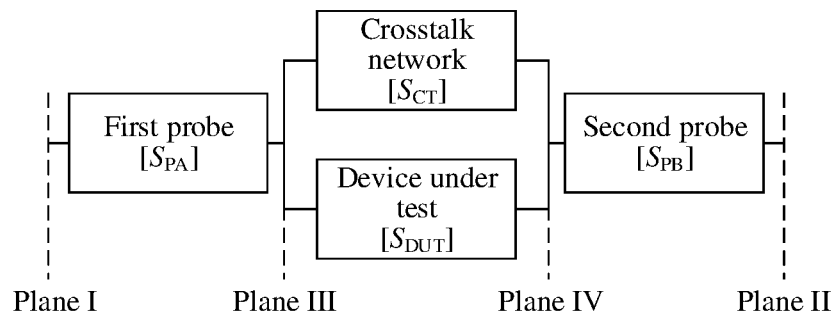
FIG. 7 is a schematic diagram of the S-parameter corresponding to each calibration plane provided by the embodiments of the present application.

Specifically, the key of using the 12-term error model to calibrate an on-wafer S-parameter measurement system is how to separate the crosstalk error network CT from the device under test (DUT). The embodiment of the present application performs three calibration processes. Referring to FIG. 6, full two-port SOLT calibration may be performed at a plane I and a plane II using a waveguide calibration standard to obtain the first S-parameter $S_m$. The first S-parameter $S_m$ is an S-parameter in case the device under test is connected in parallel with a crosstalk error network and then cascaded with the probe. One-port SOL calibration is performed at a plane III and a plane IV using a commercial calibration standard to obtain an S-parameter $S_{PA}$ of the first probe A and an S-parameter $S_{PB}$ of the second probe B, referring to the schematic diagram in FIG. 7. The relationship between the first S-parameter $S_m$ and the S-parameter $S_{PA}$ of the first probe A, the S-parameter $S_{PB}$ of the second probe B as well as the S-parameter $S_{CT|DUT}$ of the virtual "two port device" may be expressed as:

$$S_m = S_{PA} \sim S_{CT|DUT} \sim S_{PB}$$

In the formula, the symbol "~" indicates a cascading relationship, and the symbol "||" indicates a parallel relationship. The $S_{CT|DUT}$, which is the S-parameter $S_{CT|DUT}$ of the virtual "two-port device", may then be obtained by a de-embedding method. Specifically, the S-parameter $S_{PA}$ of the first probe A and the S-parameter $S_{PB}$ of the second probe B are first converted into T parameters, namely $T_{PA}$ and $T_{PB}$, and the first S-parameter $S_m$ is converted into $T_m$. Then, by the following formula $$T_{CT|DUT} = T_{PA}^{-1} * T_m * T_{PB}^{-1}$$

$T_{CT|DUT}$ is obtained. Finally, the $T_{CT|DUT}$ is converted into an S-parameter to obtain an S-parameter $S_{CT|DUT}$ in case the device under test is connected in parallel with the crosstalk error network.

Then, the crosstalk error of the test system is calibrated by the crosstalk calibration standard to obtain the S-parameter $S_{CT|open}$ in case the crosstalk error network CT is connected in parallel with the crosstalk calibration standard.

Figure 8:
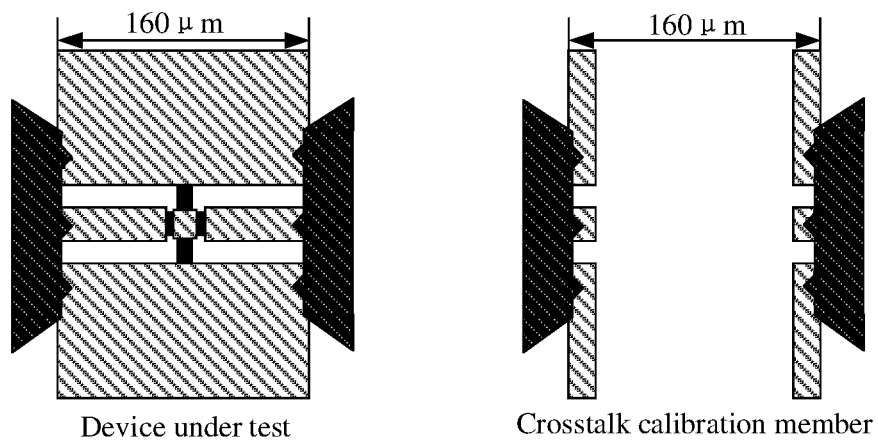
FIG. 8 is a schematic structural diagram of a device under test and a crosstalk calibration standard provided by the embodiments of the present application.

Specifically, the device under test (DUT) is removed from the substrate, and a crosstalk calibration standard equal to the device under test (DUT) in length is fabricated on the substrate. Exemplarily, referring to FIG. 8, in the present embodiment, a 10 dB attenuator may be fabricated as a device under test (DUT) using gallium arsenide as a substrate by a semiconductor process. In addition, an open-open-pair crosstalk calibration standard having the same length as the device under test (DUT) is fabricated, and both the length of the device under test (DUT) and the length of the crosstalk calibration standard are 160 μm.

Then both ends of the crosstalk calibration standard are cascaded with probes to perform two-port calibration. Knowing the S-parameter $S_{PA}$ of the first probe A and the S-parameter $S_{PB}$ of the second probe B, the S-parameter $S_{CT|open}$ in case the crosstalk error network CT is connected in parallel with the crosstalk calibration standard is obtained. Further, knowing the S-parameter $S_{open}$ of the open-open pair calibration standard (crosstalk calibration standard), the S-parameter $S_{CT}$ of the crosstalk error network is obtained from $S_{CT|open}$ and $S_{open}$. Specifically, the S-parameter $S_{CT|open}$ in case the crosstalk error network CT is connected in parallel with the crosstalk calibration standard is first converted into a Y-parameter, that is, $Y_{CT|open}$, and the S-parameter $S_{open}$ of the open-open pair calibration standard is converted into $Y_{open}$. Then, by the following formula $$Y_{VT} = Y_{CT|open} - Y_{open}$$

$Y_{CT}$ is obtained. Then $Y_{CT}$ is converted into an S-parameter to obtain the S-parameter $S_{CT}$ of the crosstalk error network.

Finally, the S-parameter $S_{DUT}$ of the device under test (DUT) is determined according to the S-parameter $S_{CT|DUT}$ in case the device under test is connected in parallel with the crosstalk error network and the S-parameter $S_{CT}$ of the crosstalk error network. Specifically, the S-parameter $S_{CT|DUT}$ in case the device under test is connected in parallel with the crosstalk error network is converted into a Y-parameter $Y_{CT|DUT}$, and the S-parameter $S_{CT}$ of the crosstalk error network is converted into a Y-parameter $Y_{CT}$. According to $$Y_{DUT} = Y_{CT|DUT} - Y_{CT}$$

the Y-parameter $Y_{DUT}$ of the device under test (DUT) is obtained. Then the $Y_{DUT}$ is converted into an S-parameter to obtain the S-parameter $S_{DUT}$ of the device under test (DUT). At this time, the crosstalk error of the S-parameter $S_{DUT}$ of the device under test (DUT) has substantially corrected.

In an embodiment, the on-wafer S-parameter error calibration method further includes the following operation.

When the length of the device under test is changed, the operations of fabricating the crosstalk calibration standard equal to the device under test in length on the substrate of the device under test and correcting the crosstalk error of the test system according to the crosstalk calibration standard are repeated.

The above-mentioned new on-wafer S-parameter calibration method mainly performs three calibrations. Mainly, a crosstalk calibration standard equal to the device under test in length is fabricated on the substrate of the device under test, and the crosstalk error of the test system is corrected according to the crosstalk calibration standard. Not only the probe distance factor is considered, but also the reflection coefficient factor of the device under test is considered, and accurate characterization and correction of the crosstalk error is realized. Furthermore, by performing two-port calibration on the waveguide end face when the probe is not connected to the test system, performing one-port calibration on the probe end face after the probe is connected, and obtaining the S-parameter of the device under test after calibration of the test system according to the 12-term error model, the accuracy of error correction in on-wafer S-parameter measurement is improved.

Those skilled in the art can understand that the sequence numbers of the operations in the foregoing embodiments do not mean the order of execution. The order of execution of the processes should be determined by their function and internal logic, and should not be construed as limiting the implementation process of the embodiments of the present application.

Embodiment 2

Figure 9:
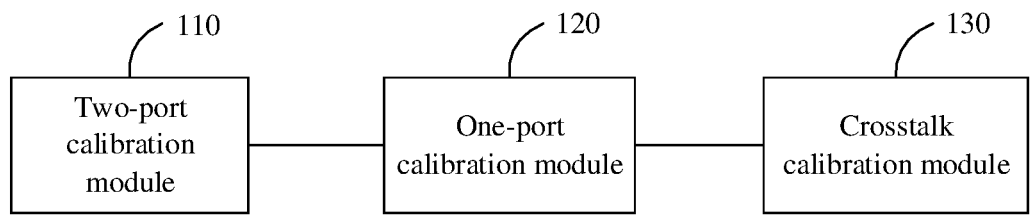
FIG. 9 is a schematic structural diagram of the new on-wafer S-parameter calibration device provided by the embodiments of the present application.

Corresponding to the new on-wafer S-parameter calibration method described in the embodiment 1, FIG. 9 is a block diagram showing the structure of the new on-wafer S-parameter calibration device in the embodiment 2 of the present application. For the convenience of explanation, only the parts related to the present embodiment are shown.

The device includes a two-port calibration module 110, a one-port calibration module 120, and a crosstalk calibration module 130.

The two-port calibration module 110 is configured to perform two-port calibration on a waveguide end face when a probe is not connected to a test system.

The one-port calibration module 120 is configured to perform one-port calibration on each of two probe end faces when the probe is connected to the test system.

The crosstalk calibration module 130 is configured to fabricate a crosstalk calibration standard equal to the device under test in length on the substrate of the device under test, and calibrate the crosstalk error of the test system according to the crosstalk calibration standard.

In an embodiment, the new on-wafer S-parameter calibration device further includes: a parameter determining module.

The parameter determining module is configured to establish a 12-term error model, and obtain the S-parameter of the device under test after calibration of the test system according to the 12-term error model.

Optionally, the parameter determining module is specifically configured to: acquire a first set of error terms through the two-port calibration, and acquire a second set of error terms through the one-port calibration, where the first set of error terms and the second set of error terms compose an 8-term error model; acquire four crosstalk error terms by correcting the crosstalk error of the test system; and establish the 12-term error model according to the 8-term error model and the four crosstalk error terms.

The above-mentioned new on-wafer S-parameter calibration device mainly performs three calibrations. Mainly, the crosstalk calibration module 130 fabricates a crosstalk calibration standard equal to the device under test in length on the substrate of the device under test, and corrects the crosstalk error of the test system according to the crosstalk calibration standard. Not only the probe distance factor is considered, but also the reflection coefficient factor of the device under test is considered, and accurate characterization and correction of the crosstalk error is realized. Furthermore, the two-port calibration module 110 performs two-port calibration on a waveguide end face when a probe is not connected to a test system, the one-port calibration module 120 performs one-port calibration on the probe end surface when the probe is connected to the test system, and finally the parameter determining module obtains the S-parameter of the device under test after calibration of the test system according to the 12-term error model, the accuracy of error correction in on-wafer S-parameter measurement is improved.

Embodiment 3

Figure 10:
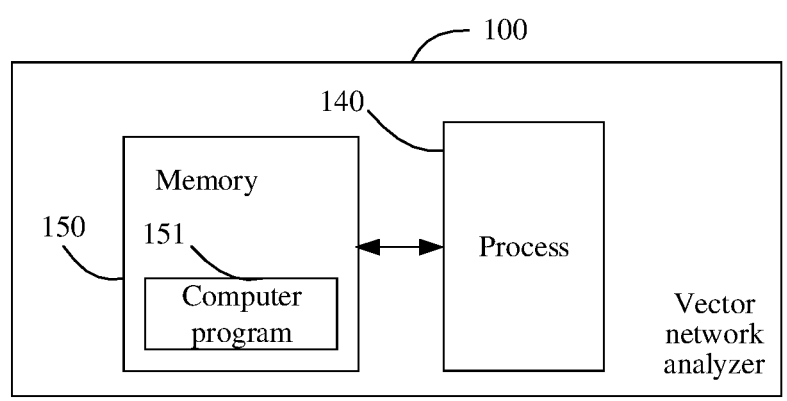
FIG. 10 is a schematic diagram of a vector network analyzer provided by the embodiments of the present application.

FIG. 10 is a schematic diagram of a vector network analyzer 100 provided by the embodiment 3 of the present application. As shown in FIG. 10, the vector network analyzer 100 of the present embodiment includes a processor 140, a memory 150, and a computer program 151 stored in the memory 150 and operable on the processor 140, for example, the program of the new on-wafer S-parameter calibration method. The processor 140, when executing the computer program 151, implements the operations in the embodiments of the new on-wafer S-parameter calibration method described above, for example, operations S101 to S103 shown in FIG. 1. Or, when the processor 140 executes the computer program 151, the functions of the modules/units in the embodiments of the foregoing device are implemented, for example, the functions of the modules 110 to 130 shown in FIG. 9.

Exemplarily, the computer program 151 may be segmented into one or more modules/units. The one or more modules/units are stored in the memory 150 and executed by the processor 140 to complete the solution of the present application. The one or more modules/units may be a series of computer program instruction segments capable of completing a particular function, and the instruction segments are configured to describe the execution process of the computer program 151 in the vector network analyzer 100. For example, the computer program 151 may be divided into a two-port calibration module, a one-port calibration module, and a crosstalk calibration module. The specific functions of each module are as follows.

The two-port calibration module 110 is configured to perform two-port calibration on a waveguide end face when a probe is not connected to a test system.

The one-port calibration module 120 is configured to perform one-port calibration on each of two probe end faces when the probe is connected to the test system.

The crosstalk calibration module 130 is configured to fabricate a crosstalk calibration standard equal to the device under test in length on the substrate of the device under test, and calibrate the crosstalk error of the test system according to the crosstalk calibration standard.

Optionally, the new on-wafer S-parameter calibration device further includes a parameter determining module.

The parameter determining module is configured to establish a 12-term error model, and obtain the S-parameter of the device under test after calibration of the test system according to the 12-term error model.

Optionally, the parameter determining module is specifically configured to: acquire a first set of error terms through the two-port calibration, and acquire a second set of error terms through the one-port calibration, where the first set of error terms and the second set of error terms compose an 8-term error model; acquire four crosstalk error terms by correcting the crosstalk error of the test system; and establish the 12-term error model according to the 8-term error model and the four crosstalk error terms.

The vector network analyzer 100 may include, but is not limited to, a processor 140 and a memory 150. It will be understood by those skilled in the art that FIG. 10 is merely an example of the vector network analyzer 100 and does not constitute a limitation to the vector network analyzer 100. The vector network analyzer 100 may include more or fewer parts than shown, or combination of some parts, or different parts. For example, the vector network analyzer 100 may further include an input and output device, a network access device, a bus, and the like.

The processor 140 may be a central processing unit (CPU), or may be other general-purpose processors, a digital signal processor (DSP), an application specific integrated circuit (ASIC), a field-programmable gate array (FPGA) or other programmable logic devices, a discrete gate or transistor logic device, a discrete hardware component, and the like. The general-purpose processor may be a microprocessor or the processor may be any conventional processor or the like.

The memory 150 may be an internal storage unit of the vector network analyzer 100, such as a hard disk or internal memory of the vector network analyzer 100. The memory 150 may also be an external storage device of the vector network analyzer 100, such as a plug-in hard disk equipped on the vector network analyzer 100, a smart media card (SMC), a secure digital (SD) card, a flash card, and the like. Further, the memory 150 may include both an internal storage unit of the vector network analyzer 100 and an external storage device. The memory 150 is configured to store the computer program and other programs and data required by the vector network analyzer 100. The memory 150 may further be configured to temporarily store data that has been output or is about to be output.

In the above embodiments, the descriptions of the embodiments have their respective focuses. For a part that is not detailed or described in an embodiment, reference may be made to the related description of other embodiments.

Those of ordinary skill in the art will appreciate that the units and algorithm operations of the examples described in the embodiments disclosed herein may be implemented by electronic hardware or a combination of computer software and electronic hardware. Whether these functions are performed with hardware or software depends on the specific application and design constraints of technical solutions. A person skilled in the art may use different methods to implement the described functions for each particular application, but such implementation should not be considered to be beyond the scope of the present application.

The integrated modules/units, if implemented in the form of software functional units and sold or used as separate products, may be stored in a computer readable storage medium. Based on such understanding, the present application may also implement all or part of the processes in the method in the foregoing embodiments by a computer program to instruct related hardware. The computer program may be stored in a computer readable storage medium, and may implement the operations of the method in the embodiments described above when executed by a processor. The computer program includes computer program code, which may be in the form of source code, object code, executable file, some intermediate forms, etc. The computer readable medium may include any entity or system capable of carrying the computer program code, a recording medium, a USB flash drive, a mobile hard disk, a magnetic disk, an optical disk, a computer memory, a read-only memory (ROM), a random access memory (RAM), electrical carrier signals, telecommunications signals, software distribution media, and the like. It should be noted that the content included in the computer readable medium may be appropriately increased or decreased according to the requirements of legislation and patent practice in the jurisdictions. For example, in some jurisdictions, according to legislation and patent practice, computer readable media does not include electrical carrier signals and telecommunications signals.

The embodiments described above are only used to explain the technical solutions of the present application, and are not limited thereto. Although the present application has been described in detail with reference to the foregoing embodiments, those of ordinary skill in the art should understand that the technical solutions described in the foregoing embodiments may still be modified, or some of the technical features may be replaced. Such modifications or replacements do not cause the essence of corresponding technical solutions to depart from the spirit and scope of the technical solutions of the respective embodiments of the present application, and are intended to be included within the scope of the present application.

The invention claimed is:

1. A new on-wafer S-parameter calibration method, comprising:
   performing two-port calibration on a waveguide end face when a probe is not connected to a test system;
   performing one-port calibration on each of two probe end faces when the probe is connected to the test system;
   correcting a crosstalk error of the test system according to a crosstalk calibration standard, wherein the crosstalk calibration standard is fabricated on a substrate of a device under test and equal to the device under test in length;
   acquiring a first set of error terms through the two-port calibration, and acquiring a second set of error terms through the one-port calibration, where the first set of error terms and the second set of error terms compose an 8-term error model;
   acquiring four crosstalk error terms by correcting the crosstalk error of the test system;
   establishing a 12-term error model according to the 8-term error model and the four crosstalk error terms; and
   obtaining an S-parameter of the device under test after calibration of the test system according to the 12-term error model.

2. The new on-wafer S-parameter calibration method of claim 1, wherein obtaining the S-parameter of the device under test after calibration of the test system according to the 12-term error model comprises:
- acquiring a first S-parameter through the two-port calibration, where the first S-parameter is an S-parameter in a case that the device under test is connected in parallel with a crosstalk error network and then cascaded with the probe;
- obtaining an S-parameter of the probe according to the first set of error terms and the second set of error terms;
- acquiring an S-parameter of the crosstalk error network by correcting the crosstalk error of the test system; and
- obtaining the S-parameter of the device under test after calibration of the test system, according to the first S-parameter, the S-parameter of the probe, and the S-parameter of the crosstalk error network.

3. The new on-wafer S-parameter calibration method of claim 1, further comprising:
- when a length of the device under test is changed, repeating the operation of correcting the crosstalk error of the test system according to a new crosstalk calibration standard, wherein the new crosstalk calibration standard is fabricated on the substrate of the device under test and equal to the device under test in length.

4. A vector network analyzer, comprising a memory, a processor, and computer programs stored in the memory and executable on the processor, wherein the processor performs a method, comprising:
- performing two-port calibration on a waveguide end face when a probe is not connected to a test system;
- performing one-port calibration on each of two probe end faces when the probe is connected to the test system;
- correcting a crosstalk error of the test system according to a crosstalk calibration standard, wherein the crosstalk calibration standard is fabricated on a substrate of a device under test and equal to the device under test in length;
- acquiring a first set of error terms through the two-port calibration, and acquiring a second set of error terms through the one-port calibration, where the first set of error terms and the second set of error terms compose an 8-term error model;
- acquiring four crosstalk error terms by correcting the crosstalk error of the test system;
- establishing a 12-term error model according to the 8-term error model and the four crosstalk error terms; and
- obtaining an S-parameter of the device under test after calibration of the test system according to the 12-term error model.

5. A non-transitory computer readable storage medium storing computer programs, wherein the computer programs perform a method, comprising:
- performing two-port calibration on a waveguide end face when a probe is not connected to a test system;
- performing one-port calibration on each of two probe end faces when the probe is connected to the test system;
- correcting a crosstalk error of the test system according to a crosstalk calibration standard, wherein the crosstalk calibration standard is fabricated on a substrate of a device under test and equal to the device under test in length;
- acquiring a first set of error terms through the two-port calibration, and acquiring a second set of error terms through the one-port calibration, where the first set of error terms and the second set of error terms compose an 8-term error model;
- acquiring four crosstalk error terms by correcting the crosstalk error of the test system;
- establishing a 12-term error model according to the 8-term error model and the four crosstalk error terms; and
- obtaining an S-parameter of the device under test after calibration of the test system according to the 12-term error model.

6. The vector network analyzer of claim 4, wherein obtaining the S-parameter of the device under test after calibration of the test system according to the 12-term error model comprises:
- acquiring a first S-parameter through the two-port calibration, where the first S-parameter is an S-parameter in a case that the device under test is connected in parallel with a crosstalk error network and then cascaded with the probe;
- obtaining an S-parameter of the probe according to the first set of error terms and the second set of error terms;
- acquiring an S-parameter of the crosstalk error network by correcting the crosstalk error of the test system; and
- obtaining the S-parameter of the device under test after calibration of the test system, according to the first S-parameter, the S-parameter of the probe, and the S-parameter of the crosstalk error network.

7. The vector network analyzer of claim 4, the method further comprising:
- when a length of the device under test is changed, repeating the operation of correcting the crosstalk error of the test system according to a new crosstalk calibration standard, wherein the new crosstalk calibration standard is fabricated on the substrate of the device under test and equal to the device under test in length.

8. The non-transitory computer readable storage medium of claim 5, wherein obtaining the S-parameter of the device under test after calibration of the test system according to the 12-term error model comprises:
- acquiring a first S-parameter through the two-port calibration, where the first S-parameter is an S-parameter in a case that the device under test is connected in parallel with a crosstalk error network and then cascaded with the probe;
- obtaining an S-parameter of the probe according to the first set of error terms and the second set of error terms;
- acquiring an S-parameter of the crosstalk error network by correcting the crosstalk error of the test system; and
- obtaining the S-parameter of the device under test after calibration of the test system, according to the first S-parameter, the S-parameter of the probe, and the S-parameter of the crosstalk error network.

9. The non-transitory computer readable storage medium of claim 5, the method further comprising:
- when a length of the device under test is changed, repeating the operation of correcting the crosstalk error of the test system according to a new crosstalk calibration standard, wherein the new crosstalk calibration standard is fabricated on the substrate of the device under test and equal to the device under test in length.

* * * * *

UNITED STATES PATENT AND TRADEMARK OFFICE
CERTIFICATE OF CORRECTION

PATENT NO. : 11,340,286 B2
APPLICATION NO. : 16/625329
DATED : May 24, 2022
INVENTOR(S) : Aihua Wu et al.

It is certified that error appears in the above-identified patent and that said Letters Patent is hereby corrected as shown below:

On the Title Page

In item (73) titled Assignee, Please delete:
"The 13th Research Institute of China Electronics"

And insert:
--The 13th Research Institute of China Electronics Technology Group Corporation--

Signed and Sealed this
Thirteenth Day of June, 2023

Katherine Kelly Vidal
*Director of the United States Patent and Trademark Office*